US010489192B2

(12) United States Patent
Guo et al.

(10) Patent No.: US 10,489,192 B2
(45) Date of Patent: Nov. 26, 2019

(54) METHOD AND CONTROLLING APPARATUS FOR AUTOMATICALLY TERMINATING AN APPLICATION OF AN ELECTRONIC APPARATUS BASED ON AUDIO VOLUME LEVEL BEING ADJUSTED LOWER THAN A THRESHOLD AUDIO VOLUME LEVEL BY A USER

(71) Applicant: BOE TECHNOLOGY GROUP CO., LTD., Beijing (CN)

(72) Inventors: Zhenpeng Guo, Beijing (CN); Junjie Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 154 days.

(21) Appl. No.: 15/533,450

(22) PCT Filed: Dec. 23, 2016

(86) PCT No.: PCT/CN2016/111746
§ 371 (c)(1),
(2) Date: Jun. 6, 2017

(87) PCT Pub. No.: WO2017/206495
PCT Pub. Date: Dec. 7, 2017

(65) Prior Publication Data
US 2018/0203725 A1    Jul. 19, 2018

(30) Foreign Application Priority Data
May 31, 2016    (CN) .......................... 2016 1 0374720

(51) Int. Cl.
*G06F 9/48*    (2006.01)
*H03G 3/32*    (2006.01)
(Continued)

(52) U.S. Cl.
CPC .............. *G06F 9/485* (2013.01); *G06F 3/167* (2013.01); *G06F 9/451* (2018.02); *H03G 3/32* (2013.01);
(Continued)

(58) Field of Classification Search
None
See application file for complete search history.

(56) References Cited

U.S. PATENT DOCUMENTS 5,778,077 A * 7/1998 Davidson ................. H03G 3/32
340/4.37
6,409,163 B1 * 6/2002 Stewart ..................... B25B 5/06
269/224
(Continued)

FOREIGN PATENT DOCUMENTS

CN         1900860 A      1/2007
CN       102138284 A  *  7/2011   ........ H04W 52/0258
(Continued)

OTHER PUBLICATIONS

International Search Report & Written Opinion dated Mar. 20, 2017 regarding PCT/CN2016/111746.
(Continued)

*Primary Examiner* — Abu Zar Ghaffari
(74) *Attorney, Agent, or Firm* — Intellectual Valley Law, P.C.

(57) ABSTRACT

The present application discloses a controlling apparatus for controlling an application of an electronic apparatus. The controlling apparatus includes a first determination logic configured to determine whether an audio volume level of the electronic apparatus is adjusted lower than a threshold audio volume level; and a termination logic configured to automatically terminate the application based on a determi-
(Continued)

nation that the audio volume level of the electronic apparatus is adjusted lower than a threshold audio volume level.

19 Claims, 4 Drawing Sheets

(51) Int. Cl.
  *G06F 3/16* (2006.01)
  *G06F 9/451* (2018.01)
  *H04N 21/41* (2011.01)
(52) U.S. Cl.
  CPC ........ *G06F 3/165* (2013.01); *G06F 2209/482* (2013.01); *H04N 21/4126* (2013.01)

(56) References Cited

U.S. PATENT DOCUMENTS

| | | | | |
|---|---|---|---|---|
| 7,392,066 | B2* | 6/2008 | Haparnas | H04M 19/044 379/373.01 |
| 8,600,457 | B2* | 12/2013 | Vargas | H04W 52/0258 455/574 |
| 8,799,965 | B2* | 8/2014 | Morimoto | B61L 3/12 381/86 |
| 9,270,242 | B2* | 2/2016 | Ito | H03F 1/52 |
| 9,420,369 | B2* | 8/2016 | Tao | H04W 52/0241 |
| 9,690,539 | B2* | 6/2017 | Sheen | H04S 7/301 |
| 2005/0100173 | A1* | 5/2005 | Eid | H03G 3/32 381/86 |
| 2005/0232439 | A1* | 10/2005 | Enomoto | H03G 3/32 381/86 |
| 2005/0282590 | A1 | 12/2005 | Haparnas | |
| 2007/0022223 | A1 | 1/2007 | Wang et al. | |
| 2008/0043996 | A1* | 2/2008 | Dolph | H04N 5/60 379/388.07 |
| 2009/0103739 | A1* | 4/2009 | Strait | G07C 9/00142 381/56 |
| 2010/0159908 | A1* | 6/2010 | Chang | H04M 1/72569 455/418 |
| 2012/0253493 | A1* | 10/2012 | Andrews | H04W 4/021 700/94 |
| 2013/0040626 | A1* | 2/2013 | Morgaine | H04W 4/00 455/418 |
| 2013/0064380 | A1* | 3/2013 | Mahowald | H03G 3/32 381/57 |
| 2013/0166054 | A1* | 6/2013 | Lee | G06F 3/165 700/94 |
| 2014/0274211 | A1* | 9/2014 | Sejnoha | H04M 1/72519 455/563 |
| 2014/0330981 | A1* | 11/2014 | Sirota | G06F 9/485 709/226 |
| 2015/0228281 | A1* | 8/2015 | Raniere | G06F 3/167 704/275 |
| 2016/0065155 | A1* | 3/2016 | Bharj | H03G 1/02 381/105 |
| 2016/0103653 | A1 | 4/2016 | Jang | |
| 2016/0147411 | A1 | 5/2016 | Li et al. | |
| 2016/0255398 | A1* | 9/2016 | Lee | H04N 21/8106 348/462 |
| 2017/0039023 | A1* | 2/2017 | Kabatek | G06F 3/165 |
| 2019/0124462 | A1* | 4/2019 | Lindahl | H04S 7/301 |

FOREIGN PATENT DOCUMENTS

| | | | | |
|---|---|---|---|---|
| CN | 102339619 | A | * | 2/2012 |
| CN | 102339619 | A | | 2/2012 |
| CN | 103412708 | A | | 11/2013 |
| CN | 104199605 | A | | 12/2014 |
| CN | 104750508 | A | | 7/2015 |
| JP | 2015206928 | A | * | 11/2015 |
| JP | 2016220066 | A | * | 12/2016 |
| KR | 20010096313 | A | * | 11/2001 |
| WO | WO-2012124776 | A1 | * | 9/2012 ......... H04M 1/6008 |
| WO | 2014067071 | A1 | | 5/2014 |
| WO | 2015048855 | A1 | | 4/2015 |

OTHER PUBLICATIONS

First Office Action in the Chinese Patent Application No. 201610374720.3, dated Sep. 4, 2018; English translation attached.

* cited by examiner

METHOD AND CONTROLLING APPARATUS FOR AUTOMATICALLY TERMINATING AN APPLICATION OF AN ELECTRONIC APPARATUS BASED ON AUDIO VOLUME LEVEL BEING ADJUSTED LOWER THAN A THRESHOLD AUDIO VOLUME LEVEL BY A USER

CROSS-REFERENCE TO RELATED APPLICATION

This application is a national stage application under 35 U.S.C. § 371 of International Application No. PCT/CN2016/111746 filed Dec. 23, 2016, which claims priority to Chinese Patent Application No. 201610374720.3, filed May 31, 2016, the contents of which are incorporated by reference in the entirety.

TECHNICAL FIELD

The present invention relates to the field of electronic apparatuses, more particularly, to a method and a controlling apparatus for controlling an application of an electronic apparatus.

BACKGROUND

Increasingly more electronic apparatuses include a touch screen, which makes it convenient to operate the electronic apparatuses. However, a user may inadvertently touch a screen key displayed on the touch screen to execute a specific function. To prevent the inadvertent operation, the electronic apparatuses typically include a screen lock mode. When it is unnecessary to operate the electronic apparatuses, the user may manually set the electronic apparatuses to a screen lock state, thereby locking an input function of the touch screen. The screen lock state may also be automatically activated when the electronic apparatuses remain in a non-operation state for a certain period of time. In order to use the touch screen to execute a function again, the user will have to unlock the screen.

SUMMARY

In one aspect, the present invention provides a controlling apparatus for controlling an application of an electronic apparatus, comprising a first determination logic configured to determine whether an audio volume level of the electronic apparatus is adjusted lower than a threshold audio volume level; and a termination logic configured to automatically terminate the application based on a determination that the audio volume level of the electronic apparatus is adjusted lower than a threshold audio volume level.

Optionally, the controlling apparatus further comprises a second determination logic configured to determine whether the electronic apparatus is in a screen lock state; wherein termination logic is configured to automatically terminate the application based on a determination that the electronic apparatus is in the screen lock state, and that the audio volume level is lower than the threshold audio volume level.

Optionally, the termination logic is configured to automatically terminate all applications running on the electronic apparatus.

Optionally, the termination logic is configured to automatically terminate an application currently outputting an audio sound running on the electronic apparatus.

Optionally, the audio volume level is one of a media audio volume level, a phone audio volume level, an alarm audio volume level, it ringtone audio volume level, and a notification audio volume level.

Optionally, the controlling apparatus further comprises a third determination logic configured to determine whether the audio volume level is maintained lower than the threshold audio volume level for a duration longer than a threshold duration; wherein the termination logic is configured to automatically terminate the application based on a determination that the audio volume level is maintained lower than the threshold audio volume level for a duration longer than the threshold duration, and that the audio volume level is lower than the threshold audio volume level.

Optionally, the controlling apparatus further comprises a fourth determination logic configured to determine whether an ambient sound volume level is higher than a threshold sound volume level; wherein the termination logic is configured to automatically terminate the application based on a determination that the ambient sound volume level is higher than the threshold sound volume level, and that the audio volume level is lower than a threshold audio volume level.

Optionally, the fourth determination logic configured to determine whether an ambient sound volume level is higher than a sound volume level of an audio sound currently outputted by the electronic apparatus; and the termination logic is configured to automatically terminate the application based on a determination that the ambient sound volume level is higher than the sound volume level of the audio sound currently outputted by the electronic apparatus, and that the audio volume level is lower than a threshold audio volume level.

Optionally, the controlling apparatus further comprises a fifth determination logic configured to determine whether the application is associated with an audio output apparatus other than the electronic apparatus; wherein the termination logic is configured to automatically terminate the application based on a determination that the application is not associated with an audio output apparatus other than the electronic apparatus, and that the audio volume level is lower than a threshold audio volume level.

Optionally, the controlling apparatus further comprises a sixth determination logic configured to determine whether the electronic apparatus is currently transferring a file over a computer network; wherein the termination logic is configured to automatically terminate the application based on a determination that the electronic apparatus is not currently transferring a file over a computer network, and that the audio volume level is lower than a threshold audio volume level.

Optionally, the controlling apparatus further comprises a seventh determination logic configured to determine whether the audio volume level is adjusted to a lowest audio volume level of the electronic apparatus; wherein the termination logic is configured to automatically terminate the application based on a determination that the audio volume level is adjusted to the lowest audio volume level of the electronic apparatus.

Optionally, the controlling apparatus fluffier comprises a display logic configured to display a list of applications automatically terminated by the controlling apparatus.

Optionally, the controlling apparatus fluffier comprises a restore logic con figured to re-activate an application from the list upon receiving a user command.

Optionally, the controlling apparatus further comprises a process logger configured to log a process of the application at time it is terminated; wherein the restore logic is configured to restore the process logged by the process logger when the application from the list is re-activated by the restore logic.

In another aspect, the present invention provides a mobile device comprising a controlling apparatus described herein.

In another aspect, the present invention provides a method for controlling an application of an electronic apparatus, comprising determining whether an audio volume level of the electronic apparatus is adjusted lower than a threshold audio volume level; and automatically terminating the application based on a determination that the audio volume level of the electronic apparatus is adjusted lower than a threshold audio volume level.

Optionally, the method further comprises determining whether the electronic apparatus is in a screen lock state; wherein automatically terminating the application comprises automatically terminating the application based on a determination that the electronic apparatus is in the screen lock state, and that the audio volume level is lower than the threshold audio volume level.

Optionally, automatically terminating the application comprises automatically terminating all applications running on the electronic apparatus.

Optionally, automatically terminating the application comprises automatically terminating an application currently outputting an audio sound running on the electronic apparatus.

Optionally, the audio volume level is one of a media audio volume level, a phone audio volume level, an alarm audio volume level, a ringtone audio volume level, and a notification audio volume level.

Optionally, the method further comprises determining whether the audio volume level is maintained lower than the threshold audio volume level for a duration longer than a threshold duration; wherein automatically terminating the application comprises automatically terminating the application based on a determination that the audio volume level is maintained lower than the threshold audio volume level for a duration longer than the threshold duration, and that the audio volume level is lower than the threshold audio volume level.

Optionally, the method further comprises determining whether an ambient sound volume level is higher than a threshold sound volume level; wherein automatically terminating the application comprises automatically terminating the application based on a determination that the ambient sound volume level is higher than the threshold sound volume level, and that the audio volume level is lower than a threshold audio volume level.

Optionally, the method further comprises determining whether an ambient sound volume level is higher than a sound volume level of an audio sound currently outputted by the electronic apparatus; wherein automatically terminating the application comprises automatically terminating the application based on a determination that the ambient sound volume level is higher than the sound volume level of the audio sound currently outputted by the electronic apparatus, and that the audio volume level is lower than a threshold audio volume level.

Optionally, the method further comprises determining whether the application is associated with an audio output apparatus other than the electronic apparatus; wherein automatically terminating the application comprises automatically terminating the application based on a determination that the application is not associated with an audio output apparatus other than the electronic apparatus, and that the audio volume level is lower than a threshold audio volume level.

Optionally, the method further comprises determining whether the electronic apparatus is currently transferring a file over a computer network wherein automatically terminating the application comprises automatically terminating the application based on a determination that the electronic apparatus is not currently transferring a file over a computer network, and that the audio volume level is lower than a threshold audio volume level.

Optionally, the method further comprises determining whether the audio volume level is adjusted to a lowest audio volume level of the electronic apparatus; wherein automatically terminating the application comprises automatically terminating the application based on a determination that the audio volume level is adjusted to the lowest audio volume level of the electronic apparatus.

Optionally, the method further comprises displaying a list of applications automatically terminated on the electronic apparatus.

Optionally, the method further comprises re-activating an application from the list upon receiving a user command.

Optionally, the method further comprises logging a process of the application at time it is terminated; and restoring the process logged by the process logger when the application from the list is re-activated.

Optionally, the electronic device is a mobile device.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
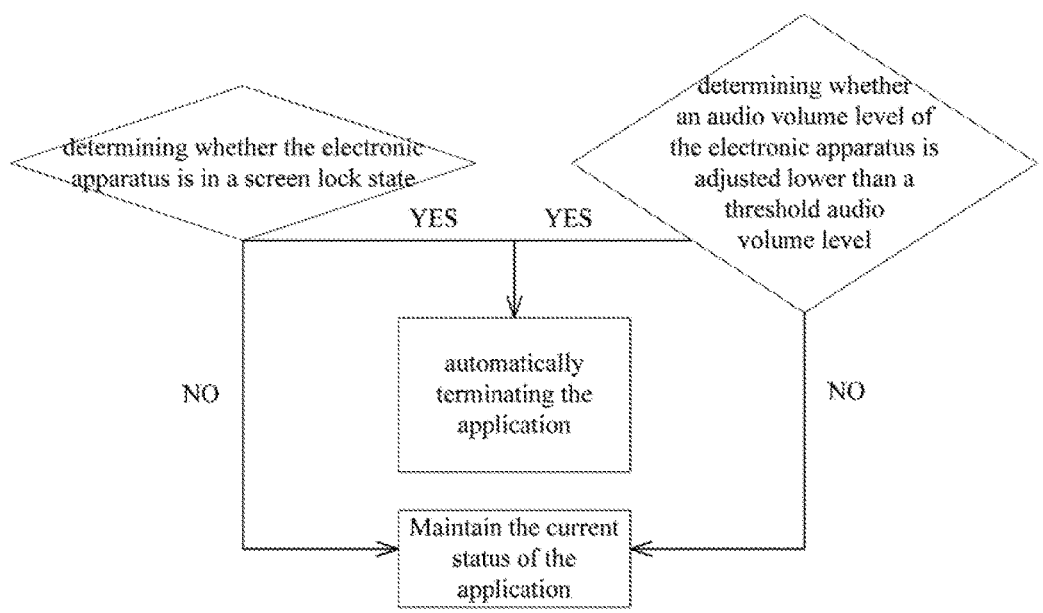
FIG. 1 is a flow chart illustrating a method of controlling an application of an electronic apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

To terminate an application in a conventional electronic apparatus, it is typically necessary to perform an operation in a display interface of the electronic apparatus. For example, to terminate an application in a mobile phone, the user has to unlock the screen of the mobile phone, and input commands through the touch screen of the mobile phone. This design requires a series of user operations in order to terminate one or more applications running on the electronic apparatus. It is very inconvenient for the user, particularly when the user is occupied with other tasks, for example, when the user is driving.

Accordingly, the present invention provides, inter alia, a method and a controlling apparatus for controlling an application of an electronic apparatus that substantially obviate one or more of the problems due to limitations and disadvantages of the related art. In one aspect, the present disclosure provides a method for controlling an application of an electronic apparatus. In some embodiments, the method includes determining whether an audio volume level of the electronic apparatus is adjusted lower than a threshold audio volume level; and automatically terminating the application based on a determination that the audio volume level of the electronic apparatus is adjusted lower than a threshold audio volume level. In one example, the step of determining whether an audio volume level of the electronic apparatus is adjusted lower than a threshold audio volume level includes determining whether the audio volume level is adjusted from an audio volume level to a second audio volume level; the first audio volume level being higher than the threshold audio volume level; the second audio volume level being lower than the threshold audio volume level; and the step of automatically terminating the application includes automatically terminating the application based on a determination that the audio volume level is adjusted from the first audio volume level to the second audio volume level.

As used herein, the term "audio volume" encompasses audio volume of any system sound produced by an electronic apparatus or an audio output apparatus (e.g. a speaker, an earphone) in communication with the electronic apparatus. The audio volume level of the electronic apparatus may be adjusted by various appropriate methods. In one example, the audio volume level of the electronic apparatus may be adjusted changing an audio volume level setting in the electronic apparatus. In another example, the audio volume level of the electronic apparatus may be adjusted by changing a setting in an audio volume slider displayed in the electronic apparatus. In another example, the audio volume level of the electronic apparatus may be adjusted by changing an audio volume level setting in an audio output apparatus in communication with the electronic apparatus. In another example, the electronic apparatus is a mobile apparatus such as a mobile phone, and the audio volume level of the mobile apparatus may be adjusted by pressing a physical volume button on the mobile apparatus.

FIG. 1 is a flow chart illustrating a method of controlling an application of an electronic apparatus in some embodiments according to the present disclosure. Referring to FIG. 1, the method in some embodiments includes determining whether an audio volume level of the electronic apparatus is adjusted lower than a threshold audio volume level and determining whether the electronic apparatus is in a screen lock state. If both conditions are met, the method further includes automatically terminating the application. If either one of the conditions is not met, the status of the application is maintained, e.g., the application is not terminated automatically. By having this design, a user can terminate an application running on the electronic apparatus without the need of first unlocking the screen of the electronic apparatus. In one example, the application running on the electronic apparatus may be a music player application, and the application may be automatically terminated when the audio volume level is adjusted below a threshold audio volume level. For example, the user may simply press the volume button on a side of the electronic apparatus to adjust the audio volume level to a value below a threshold level, and the music playing application can be automatically terminated. The present method obviates the need of unlocking the screen of the electronic apparatus first in order to terminate the application, greatly enhancing user experience.

When the electronic apparatus is not in a screen lock state, most likely it indicates that the user only intends to temporarily adjust the audio volume level to a lower level, for example, briefly greeting someone passing by. By having the design illustrated in FIG. 1, mistakenly terminating the application can be avoided, enhancing the user experience. Optionally, the determination on whether an audio volume level of the electronic apparatus is adjusted lower than a threshold audio volume level is made prior to the determination on whether the electronic apparatus is in a screen lock state. Optionally, the determination on whether the electronic apparatus is in a screen lock state is made prior to the determination on whether an audio volume level of the electronic apparatus is adjusted lower than a threshold audio volume level.

In some embodiments, the audio volume level is an audio volume level associated with an application to be terminated. Optionally, the audio volume level is an audio volume level not associated with an application to be terminated. Optionally, the audio volume level is one of a media audio volume level, a phone audio volume level, an alarm audio volume level, a ringtone audio volume level, and a notification audio volume level. In one example, the method includes determining whether a ringtone audio volume level of the electronic apparatus is adjusted lower than a threshold audio volume level; and automatically terminating one or more or all applications based on a determination that the ringtone audio volume level of the electronic apparatus is adjusted lower than a threshold audio volume level. In another example, the method includes determining whether an alarm audio volume level of the electronic apparatus is adjusted lower than a threshold audio volume level; and automatically terminating one or more or all applications based on a determination that the alarm audio volume level of the electronic apparatus is adjusted lower than a threshold audio volume level.

In some embodiments, the application being terminated is an application currently outputting an audio sound running on the electronic apparatus. Examples of application outputting an audio sound include an audio application, a video application, a telephone application, a ringtone application, an alarm application, and a notification application.

In some embodiments, the step of automatically terminating the application includes automatically terminating all applications running on the electronic apparatus. Optionally, the step of automatically terminating the application includes automatically terminating all applications running on the electronic apparatus, including those applications running on background of the electronic apparatus.

As used herein, the term "application" refers to a computer program designed to perform a specific function directly for a user, or for another application program. Optionally, the application includes a plug-in. As used herein, the term "plug-in" refers to a software component that adds a specific feature to an existing software application.

In some embodiments, the step of determining whether an audio volume level of the electronic apparatus is adjusted lower than a threshold audio volume level is triggered by one or more conditions. In one example, the step of determining whether an audio volume level of the electronic apparatus is adjusted lower than a threshold audio volume level is repeated at every specific detection interval. In another example, the step of determining whether an audio volume level of the electronic apparatus is adjusted lower than a threshold audio volume level is triggered by an event in which an audio volume level of the electronic apparatus is adjusted. For example, when a user adjusted the audio volume level of the electronic apparatus by pressing a volume button on the electronic apparatus while the electronic apparatus is in a screen lock state, it triggers the step of determining whether an audio volume level of the electronic apparatus is adjusted lower than a threshold audio volume level. The audio volume level for triggering the determination step may be any audio volume level, e.g. an audio volume level associated with the application currently outputting a sound. In another example, the triggering event is a user command to changing the audio volume setting associated with the application, e.g., a volume level slider in the application.

The threshold audio volume level may be set to various appropriate values. Optionally, the threshold audio volume level is a lowest audio volume level of the electronic apparatus. Optionally, the threshold audio volume level is an audio volume level that can be distinctly heard by a user. Optionally, the threshold audio volume level may be set to different values when the electronic apparatus is in an earphone mode or not in an earphone mode.

In some embodiments, the application is terminated based on a plurality of determinations on whether or not a plurality of conditions related to the electronic apparatus or its environment are true or false. Optionally, one of the plurality conditions is that an audio volume level of the electronic apparatus is adjusted lower than a threshold audio volume level.

Figure 2:
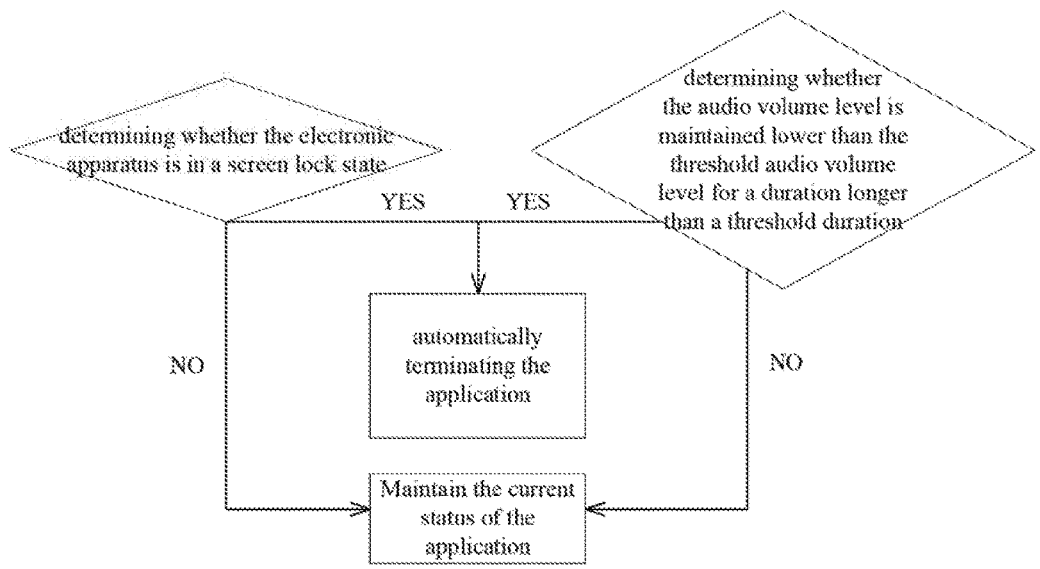
FIG. 2 is a flow chart illustrating a method of controlling an application of an electronic apparatus in some embodiments according to the present disclosure.

FIG. 2 is a flow chart illustrating a method of controlling an application of an electronic apparatus in some embodiments according to the present disclosure. Referring to FIG. 2, the method in some embodiments includes determining whether an audio volume level of the electronic apparatus is adjusted lower than a threshold audio volume level and determining whether the audio volume level is maintained lower than the threshold audio volume level for a duration longer than a threshold duration. If both conditions are met, the method further includes automatically terminating the application. If either one of the conditions is not met, the status of the application is maintained, e.g., the application is not terminated automatically. In one example, a user is listening to music on a mobile phone, and a passerby comes up and ask the user for directions. The user temporarily adjusts the audio volume level of the mobile phone below a threshold level, however, does not intend to terminate the music playing application that is running on the mobile phone. By implementing a method as illustrated in FIG. 2, the user can simply resume the audio volume level of the mobile phone when the conversation with the passerby is finished, without the need of unlocking the screen of the electronic apparatus and re-starting the music playing application again.

Figure 3:
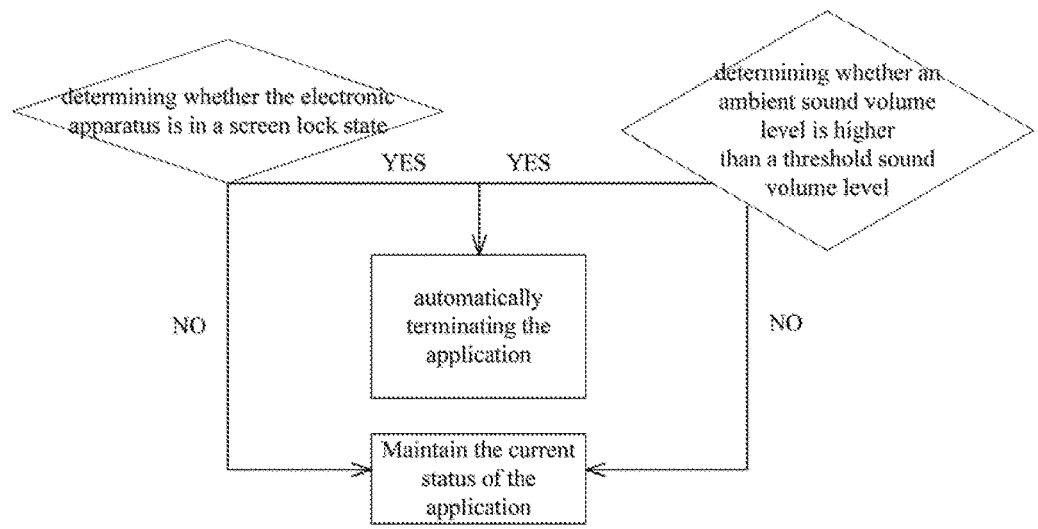
FIG. 3 is a flow chart illustrating a method of controlling an application of an electronic apparatus in some embodiments according to the present disclosure.

FIG. 3 is a flow chart illustrating a method of controlling an application of an electronic apparatus in some embodiments according to the present disclosure. Referring to FIG. 3, the method in some embodiments includes determining whether an audio volume level of the electronic apparatus is adjusted lower than a threshold audio volume level and determining whether an ambient sound volume level is higher than a threshold sound volume level. If both conditions are met, the method further includes automatically terminating the application. If either one of the conditions is not met, the status of the application is maintained, e.g., the application is not terminated automatically. When the ambient sound volume level is higher than a threshold sound volume level, most likely the user does not intend to continue listening to the content broadcasted by the electronic apparatus. Termination of the application when both conditions are met most likely would not violate the user intent. Optionally, the determination on whether an audio volume level of the electronic apparatus is adjusted lower than a threshold audio volume level is made prior to the determination on whether an ambient sound volume level is higher than a threshold sound volume level. Optionally, the determination on whether an ambient sound volume level is higher than a threshold sound volume level is made prior to the determination on whether an audio volume level of the electronic apparatus is adjusted lower than a threshold audio volume level.

In some embodiments, the ambient sound volume level is determined as a cumulative ambient sound level, for example, ambient sound levels cumulated during a time interval (e.g., 5 seconds, 10 seconds). Optionally, in the method illustrated in FIG. 3, the threshold audio volume level and the threshold sound volume level are set to be substantially the same. Optionally, the threshold audio volume level and the threshold sound volume level are set to be different. Optionally, the determination on whether an audio volume level of the electronic apparatus is adjusted lower than a threshold audio volume level is made prior to the determination on whether an ambient sound volume level is higher than a threshold sound volume level. Optionally, the determination on whether an ambient sound volume level is higher than a threshold sound volume level is made prior to the determination on whether an audio volume level of the electronic apparatus is adjusted lower than a threshold audio volume level.

In some embodiments, the method includes determining whether an audio volume level of the electronic apparatus is adjusted lower than a threshold audio volume level and determining whether an ambient sound volume level is higher than a sound volume level of an audio sound currently outputted by the electronic apparatus. If both conditions are met, the method further includes automatically terminating the application. If either one of the conditions is not met, the status of the application is maintained, e.g., the application is not terminated automatically.

Figure 4:
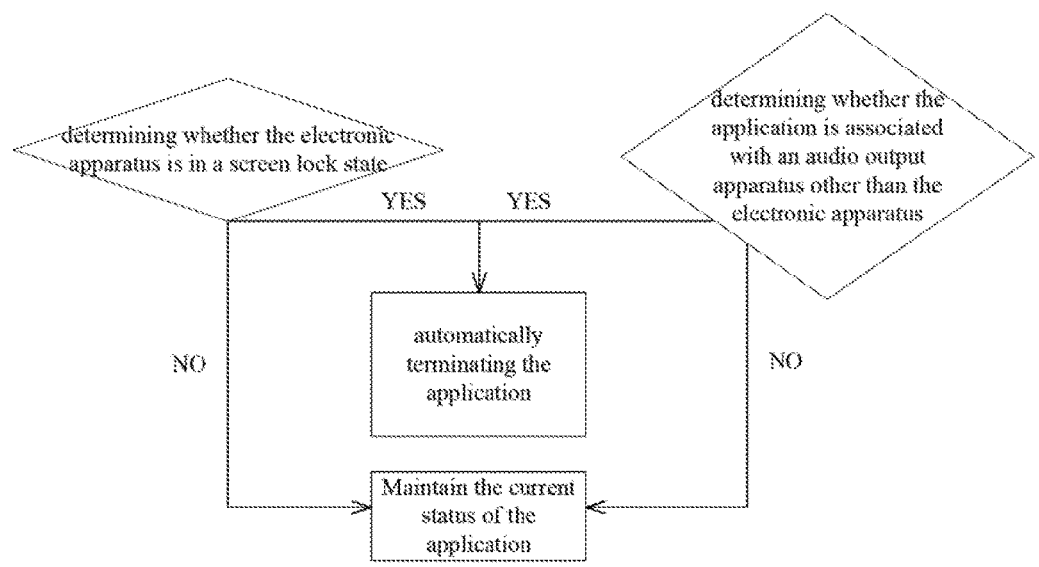
FIG. 4 is a flow chart illustrating a method of controlling an application of an electronic apparatus in some embodiments according to the present disclosure.

FIG. 4 is a flow chart illustrating a method of controlling an application of an electronic apparatus in some embodiments according to the present disclosure. Referring to FIG. 4, the method in some embodiments includes determining whether an audio volume level of the electronic apparatus is adjusted lower titan a threshold audio volume level and determining whether the application is associated with an audio output apparatus other than the electronic apparatus. If both conditions are met, the method limber includes automatically terminating the application. If either one of the conditions is not met, the of the application is maintained, e.g., the application is not terminated automatically. When the application is associated with an audio output apparatus other than the electronic apparatus, the audio volume level is typically set lower than usual. For example, when a user is listening to a sound track using an earphone plugged in a mobile phone, the audio volume level of the mobile phone is typically set at a lower level as compared to that when the user is listening to the music using a speaker of the mobile phone. Thus, it is more likely to violate the user's intent if the application is terminated when the application is associated with an audio output apparatus (e.g., an earphone) other than the electronic apparatus (e.g., a mobile phone), even though the audio volume level of the electronic apparatus is determined to be lower than the threshold audio volume level. By having the design illustrated in FIG. 4, mistakenly terminating the application can be avoided, enhancing the user experience. Optionally, the determination on whether an audio volume level of the electronic apparatus is adjusted lower than a threshold audio volume level is made prior to the determination on whether the application is associated with an audio output apparatus other than the electronic apparatus. Optionally, the determination on whether the application is associated with an audio output apparatus other than the electronic apparatus is made prior to the determination on whether an audio volume level of the electronic apparatus is adjusted lower than a threshold audio volume level.

Figure 5:
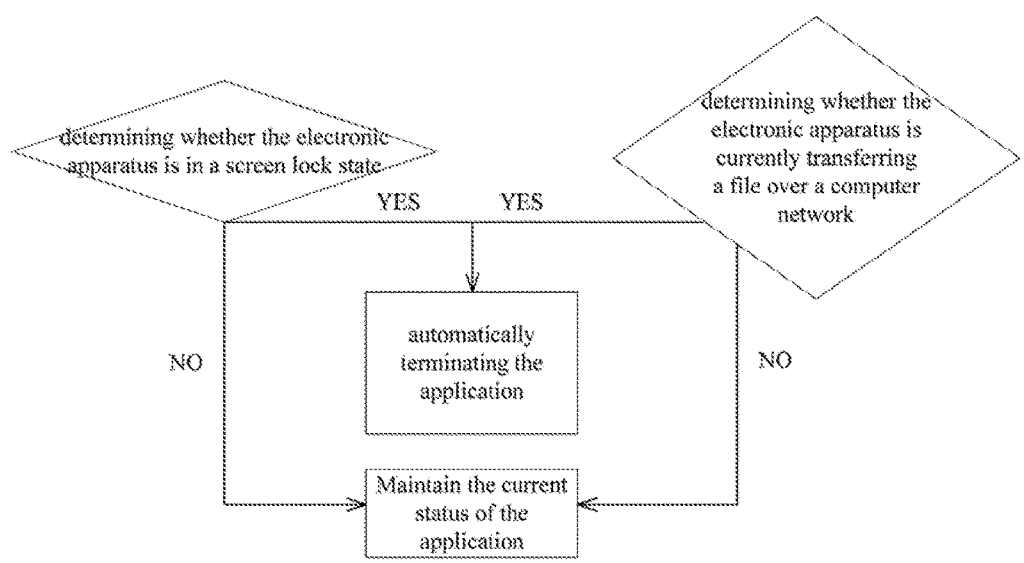
FIG. 5 is a flow chart illustrating a method of controlling an application of an electronic apparatus in some embodiments according to the present disclosure.

FIG. 5 is a flow chart illustrating a method of controlling an application of an electronic apparatus in some embodiments according to the present disclosure. Referring to FIG. 5, the method in some embodiments includes determining whether an audio volume level of the electronic apparatus is adjusted lower than a threshold audio volume level and determining whether the electronic apparatus is currently transferring a file over a computer network. If both conditions are met, the method further includes automatically terminating the application. If either one of the conditions is not met, the status of the application maintained, e.g., the application is not terminated automatically. By having this design, the ongoing file transfer process will not be disrupted. Optionally, the determination on whether an audio volume level of the electronic apparatus is adjusted lower than a threshold audio volume level is made prior to the determination on whether the electronic apparatus is currently transferring a file over a computer network. Optionally, the determination on whether the electronic apparatus is currently transferring a file over a computer network is made prior to the determination on whether an audio volume level of the electronic apparatus is adjusted lower than a threshold audio volume level.

In some embodiments, the step of automatically terminating the application is performed according to a preset policy. Optionally, the preset policy includes terminating all applications running on the electronic apparatus. Optionally, the preset policy includes terminating any applications currently outputting an audio sound. Optionally, the preset policy includes terminating only the applications currently outputting an audio sound, the audio volume level of which is lower than the threshold audio volume level. When the application is broadcasting at a low audio volume level, most likely it indicates that the user is not paying attention to the contents being broadcasted. Termination of the application at this time most likely will not violate the user's intent, and can effectively avoid unnecessary power consumption.

In some embodiments, the method includes determining whether an audio volume level of the electronic apparatus is adjusted lower than a threshold audio volume level; and automatically terminating the application based on a determination that the audio volume level of the electronic apparatus is adjusted lower than a threshold audio volume level and one or more determinations on whether or not one or more other conditions are met. The one or more other conditions include, but are not limited to, whether the electronic apparatus is in a screen lock state, whether the audio volume level is maintained lower than the threshold audio volume level for a duration longer than a threshold duration, whether an ambient sound volume level is higher than a threshold sound volume level, whether an ambient sound volume level is higher than a sound volume level of an audio sound currently outputted by the electronic apparatus, whether the application is associated with an audio output apparatus other than the electronic apparatus, whether the electronic apparatus is currently transferring a file over a computer network, whether the audio volume level is adjusted to a lowest audio volume level of the electronic apparatus.

In some embodiments, the one or mote other conditions include, but are not limited to, whether the battery power level is lower than a threshold battery power level, whether the electronic apparatus is in an airplane mode, whether the brightness level of a display panel of the electronic apparatus is lower than a threshold brightness level.

In one example, the method includes determining whether an audio volume level of the electronic apparatus is adjusted lower than a threshold audio volume level, determining whether the electronic apparatus is in a screen lock state, determining whether the application is associated with an audio output apparatus other than the electronic apparatus. If all above conditions are met, e.g., the audio volume level of the electronic apparatus is adjusted lower than a threshold audio volume level, the electronic apparatus is in a screen lock state, and the application is associated with an audio output apparatus other than the electronic apparatus, the method further includes determining whether an ambient sound volume level is higher than a threshold sound volume level. If the ambient sound volume level is higher than the threshold sound volume level, the method further includes determining whether the audio volume level is maintained lower than the threshold audio volume level for a duration longer than a threshold duration. If the audio volume level is maintained lower than the threshold audio volume level for a duration longer than the threshold duration, the method further includes automatically terminating the application. If an answer to any of the above determination steps is false, the method includes maintaining the status of the application, e.g., the application is not terminated automatically.

In another example, the method includes determining whether the electronic apparatus is in a screen lock state, and determining whether an audio volume level of the electronic apparatus is adjusted lower than a threshold audio volume level. If both conditions are met, the method further includes determining whether the audio volume level is maintained lower than the threshold audio volume level for a duration longer than a threshold duration. If the answer is yes, the method further includes automatically terminating the application. If an answer to any of the above determination steps is false, the method includes maintaining the status of the application, e.g., the application is not terminated automatically.

In another example, the method includes determining whether the electronic apparatus is in a screen lock state, and determining whether an audio volume level of the electronic apparatus is adjusted lower than a threshold audio volume level. If both conditions are met, the method further includes determining whether the audio volume level is maintained lower than the threshold audio volume level for a duration longer than a threshold duration. If the audio volume level is maintained lower than the threshold audio volume level for a duration longer than a threshold duration, the method further includes determining whether the application is associated with an audio output apparatus other than the electronic apparatus. If the answer is yes, the method further includes automatically terminating the application. If an answer to any of the above determination steps is false, the method includes maintaining the status of the application, e.g., the application is not terminated automatically.

In another example, the method includes determining whether the electronic apparatus is in a screen lock state, and determining whether an audio volume level of the electronic apparatus is adjusted lower than a threshold audio volume level. If both conditions are met, the method further includes determining whether the audio volume level is maintained lower than the threshold audio volume level for a duration longer than a threshold duration. If the answer is yes, the method further includes terminating all applications running on the electronic apparatus including those running on the background. If an answer to any of the above determination steps is false, the method includes maintaining the status of all applications running on the electronic apparatus.

In another example, the method includes determining whether an audio volume level of the electronic apparatus is adjusted lower than a threshold audio volume level. The method further includes at least one of the following determination steps: (1) determining whether the electronic apparatus is in a screen lock state; (2) determining whether the audio volume level is maintained lower than the threshold audio volume level for a duration longer than a threshold duration; (3) determining whether an ambient sound volume level is higher than a threshold sound volume level; (4) determining whether an ambient sound volume level is higher than a sound volume level of an audio sound currently outputted by the electronic apparatus; (5) determining whether the application is associated with an audio output apparatus other than the electronic apparatus; (6) determining whether the electronic apparatus is currently transferring a file over a computer network; and (7) determining whether the audio volume level is adjusted to a lowest audio volume level of the electronic apparatus. If the audio volume level of the electronic apparatus is adjusted lower than the threshold audio volume level, and if the answer to at least one of (1) to (7) determination steps is true, the method further includes automatically terminating the application.

In some embodiments, the method further includes a step of displaying a list of applications automatically terminated by the controlling apparatus on the electronic apparatus. By having a list of applications automatically terminated by the controlling apparatus displayed on the electronic apparatus, the user has the option of re-activating one or more applications later on. Accordingly, the method in some embodiments further includes re-activating an application from the list upon receiving a user command. In one example, the user may unlock the screen of the electronic apparatus, and click on one of the applications displayed in the list to re-activate the application.

In some embodiments, the method further includes logging a process of the application at time it is terminated. The process of the application may be stored in a memory. Optionally, the method further includes restoring the process logged by the process logger when the application from the list is re-activated.

In another aspect, the present disclosure provides a controlling apparatus for controlling an application of an electronic apparatus. In some embodiments, the controlling apparatus includes a first determination logic configured to determine whether an audio volume level of the electronic apparatus is adjusted lower than a threshold audio volume level; and a termination logic configured to automatically terminate the application based on a determination that the audio volume level of the electronic apparatus is adjusted lower than a threshold audio volume level. In one example, the first determination logic configured to determine whether the audio volume level is adjusted from an audio volume level to a second audio volume level; the first audio volume level being higher than the threshold audio volume level; the second audio volume level being lower than the threshold audio volume level; and the termination logic is configured to automatically terminate the application based on a determination that the audio volume level is adjusted from the first audio volume level to the second audio volume level. Optionally, the electronic apparatus is a mobile apparatus.

As used herein, the term "logic" refers to hardware (e.g. a board, circuit, chip, etc.), software and/or firmware configured to carry out operations according to the invention. For instance, features of the invention may be accomplished by specific circuits under control of a computer program or program modules stored on a suitable computer-readable medium, where the program modules are configured to control the execution of memory operations using the circuitry of the interface.

As used herein, the term "mobile device" may particularly denote a mobile communication device, such as a mobile phone, a smart phone, a personal digital assistant (PDA), a tablet computer, a laptop or any similar device capable of communication via a data communication network, such as cellular communication network or a wired or wireless data network.

Figure 6:
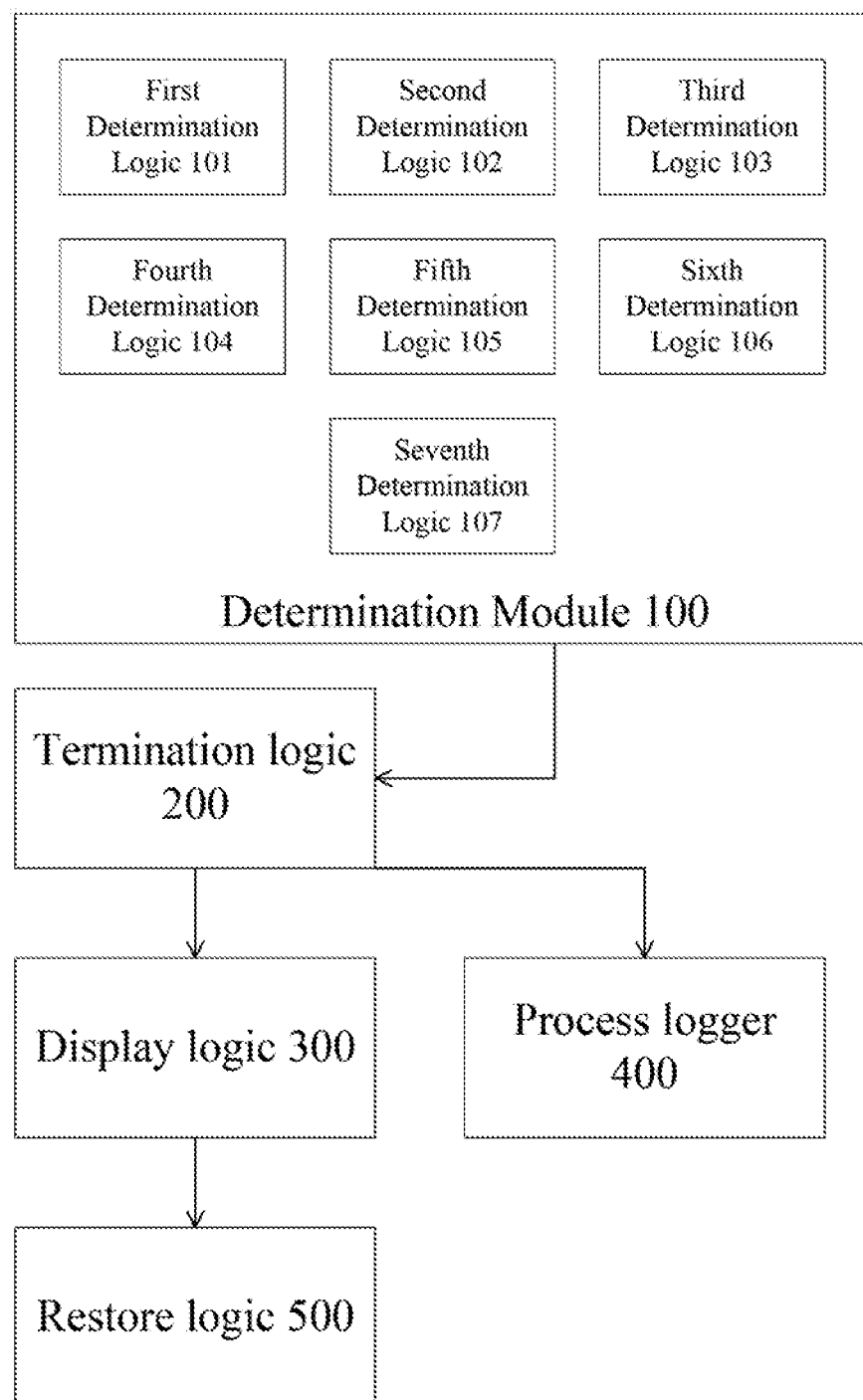
FIG. 6 is a schematic diagram illustrating the structure of a controlling apparatus for controlling an application of an electronic apparatus in some embodiments according to the present disclosure.

FIG. 6 is a schematic diagram illustrating the stricture of a controlling apparatus for controlling an application of an electronic apparatus in some embodiments according to the present disclosure. Referring to FIG. 6, the controlling apparatus in some embodiments includes a determination module 100 and a termination logic 200. The termination logic 200 is configured to automatically terminate the application based on one or more determinations made by the determination module 100 regarding whether or not one or more conditions related to the electronic apparatus or its environment are true or false. In one example, the determination module 100 includes a first determination ionic 101 configured to determine whether an audio volume level of the electronic apparatus is adjusted lower than a threshold audio volume level. The termination logic 200 is configured to automatically terminate the application based on a determination that the audio volume level of the electronic apparatus is adjusted lower than a threshold audio volume level.

In some embodiments, the audio volume level is an audio volume level associated with an application to be terminated. Optionally, the audio volume level is an audio volume level not associated with an application to be terminated. Optionally, the audio volume level is one of a media audio volume level, a phone audio volume level, an alarm audio volume level, a ringtone audio volume level, and a notification audio volume. In one example, the first determination logic 101 configured to determine whether a ringtone audio volume level of the electronic apparatus is adjusted lower than a threshold audio volume level; and the termination logic 200 is configured to automatically terminate one or more or all applications based on a determination that the ringtone audio volume level of the electronic apparatus is adjusted lower than a threshold audio volume level. In another example, the first determination logic 101 configured to determine whether an alarm audio volume level of the electronic apparatus is adjusted lower than a threshold audio volume level; and the termination logic 200 is configured to automatically terminate one or more or all applications based on a determination that the alarm audio volume level of the electronic apparatus is adjusted lower than a threshold audio volume level.

In some embodiments, the application being terminated is an application currently outputting an audio sound running on the electronic apparatus. Examples of application outputting an audio sound include an audio application, a video application, a telephone application, a ringtone application, an alarm application, and a notification application.

In some embodiments the termination logic is configured to automatically terminate all applications running on the electronic apparatus. Optionally, the termination logic is configured to automatically terminate all applications running on the electronic apparatus, including those applications running on background of the electronic apparatus.

Referring to FIG. 6, the determination module 100 in some embodiments further includes a second determination logic 102 configured to determine whether the electronic apparatus is in a screen lock state. Optionally, the termination logic 200 is configured to automatically terminate the application based on a determination that the electronic apparatus is in the screen lock state, and that the audio volume level is lower than the threshold audio volume level.

Referring to FIG. 6, the determination module 100 in some embodiments further includes a third determination logic 103 configured to determine whether the audio volume level is maintained lower than the threshold audio volume level for a duration longer than a threshold duration. Optionally, the termination logic 200 is configured to automatically terminate the application based on a determination that the audio volume level is maintained lower than the threshold audio volume level for a duration longer than the threshold duration, and that the audio volume level is lower than the threshold audio volume level.

Referring to FIG. 6, the determination module 100 in some embodiments further includes a fourth determination logic 104 configured to determine whether an ambient sound volume level is higher than a threshold sound volume level. Optionally, the termination logic 200 is configured to automatically terminate the application based on a determination that the ambient sound volume level is higher than the threshold sound volume level, and that the audio volume level is lower than a threshold audio volume level.

In some embodiments, the controlling apparatus further includes an ambient sound detector. Optionally, the ambient sound detector includes a sound sensor. Examples of sound sensors include various microphones, e.g., an electret condenser microphone. Optionally, the ambient sound detectors include a pressure sensor. The pressure sensor receives a sound wave and generates a pressure signal. Based on the pressure signal, a signal representing the ambient sound volume level is generated.

Referring to FIG. 6, the determination module 100 in some embodiments further includes a fifth determination logic 105 configured to determine whether the application is associated with an audio output apparatus other than the electronic apparatus. Optionally, the termination logic 200 is configured to automatically terminate the application based on a determination that the application is not associated with an audio output apparatus other than the electronic apparatus, and that the audio volume level is lower than a threshold audio volume level.

Referring to FIG. 6, the determination module 100 in some embodiments further includes a sixth determination logic 106 configured to determine whether the electronic apparatus is currently transferring a file over a computer network. Optionally, the termination logic 200 is configured to automatically terminate the application based on a determination that the electronic apparatus is not currently transferring a file over a computer network, and that the audio volume level is lower than a threshold audio volume level.

Referring to FIG. 6, the determination module 100 in some embodiments further includes a seventh determination logic 107 configured to determine whether the audio volume level is adjusted to a lowest audio volume level of the electronic apparatus. Optionally, the termination logic 200 is configured to automatically terminate the application based on a determination that the audio volume level is adjusted to the lowest audio volume level of the electronic apparatus.

Referring to FIG. 6, the controlling apparatus in some embodiments further includes a display logic configured to display a list of applications automatically terminated by the controlling apparatus. In some embodiments, the controlling apparatus further includes a restore logic configured to re-activate an application from the list upon receiving a user command. Optionally, the controlling apparatus further includes a process logger configured to log a process of the application at time it is terminated. Optionally, the restore logic is configured to restore the process logged by the process logger when the application from the list is re-activated by the restore logic.

In some embodiments, the determination module 100 further includes one or more determination logics configured to determine at least one of whether the battery power level is lower than a threshold battery power level, whether the electronic apparatus is in an airplane mode, whether the brightness level of a display panel of the electronic apparatus is lower than a threshold brightness level.

In some embodiments, the determination module 100 includes only one determination logic, e.g., the first determination logic 101, but does not include any other determination logics. Optionally, the determination module 100 includes the first determination logic 101, and one or more determination logics selected from the group including the second determination logic 102, the third determination logic 103, the fourth determination logic 104, the fifth determination logic 105, the sixth determination logic 106, and the seventh determination logic 107. Optionally, the determination module 100 further includes an additional determination module, e.g., a determination module configured to determine whether the battery power level is lower than a threshold battery power level, whether the electronic apparatus is in an airplane mode, whether the brightness level of a display panel of the electronic apparatus is lower than a threshold brightness level. Optionally, the determination module 100 includes the first determination logic 101, the second determination logic 102, the third determination logic 103, the fourth determination logic 104, the fifth determination logic 105, the sixth determination logic 106, and the seventh determination logic 107.

In some embodiments, the controlling apparatus described herein is a component of the electronic apparatus. Optionally, the controlling apparatus described herein is integrated into or attached to the electronic apparatus. In some embodiments, the electronic apparatus is a display apparatus. Optionally, the electronic apparatus is a mobile apparatus. Optionally, the electronic apparatus is a mobile phone. Optionally, the electronic apparatus has a screen lock mode. Optionally, the electronic apparatus has a touch screen.

Functions, operations, components or features described herein with reference to one or more embodiments, may be combined with, or may be utilized in combination with, one or more other functions, operations, components or features described herein with reference to one or more other embodiments, or vice versa.

Some embodiments may be implemented by hardware, by software, or by any combination of hardware and/or software as may be suitable for specific applications or in accordance with specific design requirements. Some embodiments may include units and/or sub-units, which may be separate of each other or combined together, in whole or in part, and may be implemented using specific, multi-purpose or general processors or controllers. Some embodiments may include buffers, registers, stacks, storage units and/or memory units, for temporary or long-term storage of data or in order to facilitate the operation of particular implementations.

Embodiments of the present disclosure can include systems for implementing the described methods, as well as computer-readable storage medium coded with instructions for causing a computer to execute the described methods. For example, an electronic system including a processor, a memory and an electronic communication device may be configured to interpolate a pixel and enhancing an edge in an image. The system may represent a user computer system, wireless communication devices, subnetworks, a server, or any other network-capable device with the requisite functional capabilities.

The system and servers may include any number of processors that are coupled to storage devices including a first storage (typically a random access memory, or "RAM"), second storage (typically a read only memory, or "ROM"). Both of these storage devices may include any suitable type of the computer-readable media described and/or mentioned above. A mass storage device may also be used to store programs, data and the like and is typically a secondary storage medium, such as a hard disk that is slower than primary storage. It will be appreciated that the information retained within the mass storage device, may, in appropriate cases, be incorporated in standard manner as part of primary storage as virtual memory. A specific mass storage device such as a CD-ROM may also pass data uni-directionally to the processor.

A computer system may also include an interface that includes one or more input/output devices such as video monitors, track balls, mice, keyboards, microphones, touch-sensitive displays, transducer card readers, magnetic or paper tape readers, tablets, styluses, voice or handwriting recognizers, or other known input devices, including other appropriately linked computers. The system may be coupled to a computer or other electronic communication network using a network connection. The network can connect various wired, optical, electronic and other known networks to exchange information among computers, servers, wireless communication devices, and sub-networks. With such a network connection, it is contemplated that the system and the processor(s) therein may receive information from the network, or may output information to the network in the course of performing the above-described method steps. The hardware elements described above may be configured to act as one or more units for performing the operations described above.

In addition, embodiments of the present disclosure further include computer-readable storage media that include program instructions for performing various computer-implemented operations of the described methods. The media may also include, alone or in combination with the program instructions, data files, data structures, tables, and the like. The media and program instructions may be those specially designed and constructed for the purposes of the present subject matter, or they may be of the kind available to those having skill in the computer software arts. Examples of computer-readable storage media include magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention fir various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations ma be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A controlling apparatus for controlling an application of an electronic apparatus, comprising:
a non-transitory computer readable memory; and
one or more processors;
wherein the memory and the one or more processors are connected with each other; and
the memory stores computer-executable instructions for controlling the one or more processors to
determine whether an audio volume level of the electronic apparatus is adjusted lower than a threshold audio volume level in response to a manual change in an audio volume level setting;
determine whether an ambient sound volume level is higher than a threshold sound volume level;
determine whether the application is associated with an audio output apparatus other than the electronic apparatus; and automatically terminate the application based on (1) the determination that the audio volume level of the electronic apparatus is adjusted lower than the threshold audio volume level in response to the manual change in the audio volume level setting, (2) the determination that the ambient sound volume level is higher than the threshold sound volume level, and (3) the determination that the application is not associated with an audio output apparatus other than the electronic apparatus;

wherein the manual change in the audio volume level setting comprises one or a combination of:

a manual change of a setting of a physical volume adjuster of the electronic apparatus;

a manual change of a setting of a physical volume adjuster of an audio output apparatus in communication with the electronic apparatus;

a manual change in a setting in an audio volume slider displayed in the electronic apparatus; and a manual change in a setting in an audio volume slider displayed in the audio output apparatus in communication with the electronic apparatus.

2. The controlling apparatus of claim 1, wherein the non-transitory computer readable memory further stores computer-executable instructions for controlling the one or more processors to determine whether the electronic apparatus is in a screen lock state; and automatically terminate the application further based on the determination that the electronic apparatus is in the screen lock state.

3. The controlling apparatus of claim 1, wherein the non-transitory computer readable memory further stores computer-executable instructions for controlling the one or more processors to automatically terminate all applications running on the electronic apparatus.

4. The controlling apparatus of claim 1, wherein the non-transitory computer readable memory further stores computer-executable instructions for controlling the one or more processors to automatically terminate the application currently outputting an audio sound running on the electronic apparatus.

5. The controlling apparatus of claim 4, wherein the audio volume level is one of a media audio volume level, a phone audio volume level, an alarm audio volume level, a ringtone audio volume level, and a notification audio volume level.

6. The controlling apparatus of claim 1, the non-transitory computer readable memory further stores computer-executable instructions for controlling the one or more processors to determine whether the audio volume level is maintained lower than the threshold audio volume level for a duration longer than a threshold duration; and automatically terminate the application further based on the determination that the audio volume level is maintained lower than the threshold audio volume level for the duration longer than the threshold duration.

7. The controlling apparatus of claim 1, wherein the non-transitory computer readable memory further stores computer-executable instructions for controlling the one or more processors to determine whether an ambient sound volume level is higher than a sound volume level of an audio sound currently outputted by the electronic apparatus; and automatically terminate the application further based on the determination that the ambient sound volume level is higher than the sound volume level of the audio sound currently outputted by the electronic apparatus, and that the audio volume level is lower than the threshold audio volume level.

8. The controlling apparatus of claim 1, the non-transitory computer readable memory further stores computer-executable instructions for controlling the one or more processors to determine whether the electronic apparatus is currently transferring a file over a computer network; and automatically terminate the application further based on the determination that the electronic apparatus is not currently transferring the file over a computer network, and that the audio volume level is lower than the threshold audio volume level.

9. The controlling apparatus of claim 1, the non-transitory computer readable memory further stores computer-executable instructions for controlling the one or more processors to determine whether the audio volume level is adjusted to a lowest audio volume level of the electronic apparatus which is lower than the threshold audio volume level; and automatically terminate the application further based on the determination that the audio volume level is adjusted to the lowest audio volume level of the electronic apparatus.

10. The controlling apparatus of claim 1, further comprising a display panel; and the non-transitory computer readable memory further stores computer-executable instructions for controlling the one or more processors to display a list of applications automatically terminated by the controlling apparatus.

11. The controlling apparatus of claim 10, the non-transitory computer readable memory further stores computer-executable instructions for controlling the one or more processors to re-activate an application from the list upon receiving a user command.

12. The controlling apparatus of claim 11, the non-transitory computer readable memory further stores computer-executable instructions for controlling the one or more processors to log a process of the application at time it is terminated; and restore the process logged by the process logger when the application from the list is re-activated by the restore logic.

13. A mobile device, comprising a controlling apparatus of claim 1.

14. A method for controlling an application of an electronic apparatus, comprising:

determining whether an audio volume level of the electronic apparatus is adjusted lower than a threshold audio volume level in response to a manual change in an audio volume level setting;

determining whether an ambient sound volume level is higher than a threshold sound volume level;

determining whether the application is associated with an audio output apparatus other than the electronic apparatus; and automatically terminating the application based on (1) the determination that the audio volume level of the electronic apparatus is adjusted lower than the threshold audio volume level in response to the manual change in the audio volume level setting, (2) the determination that the ambient sound volume level is higher than the threshold sound volume level, and (3) the determination that the application is not associated with an audio output apparatus other than the electronic apparatus;

wherein the manual change in the audio volume level setting comprises one or a combination of:

a manual change of a setting of a physical volume adjuster of the electronic apparatus;

a manual change of a setting of a physical volume adjuster of an audio output apparatus in communication with the electronic apparatus;

a manual change in a setting in an audio volume slider displayed in the electronic apparatus; and a manual change in a setting in an audio volume slider displayed in the audio output apparatus in communication with the electronic apparatus.

15. The method of claim 14, further comprising:

determining whether the electronic apparatus is in a screen lock state;

wherein automatically terminating the application comprises automatically terminating the application further based on the determination that the electronic apparatus is in the screen lock state.

16. The method of claim 14, wherein automatically terminating the application comprises automatically terminating all applications running on the electronic apparatus.

17. The method of claim 14, wherein automatically terminating the application comprises automatically terminating an application currently outputting an audio sound running on the electronic apparatus.

18. The method of claim 17, wherein the audio volume level is one of a media audio volume level, a phone audio volume level, an alarm audio volume level, a ringtone audio volume level, and a notification audio volume level.

19. The method of claim 14, further comprising determining whether an ambient sound volume level is higher than a sound volume level of an audio sound currently outputted by the electronic apparatus;

wherein automatically terminating the application comprises automatically terminating the application further based on the determination that the ambient sound volume level is higher than the sound volume level of the audio sound currently outputted by the electronic apparatus.

* * * * *